United States Patent [19]
Sosnowski

[11] Patent Number: 5,889,229
[45] Date of Patent: Mar. 30, 1999

[54] SELF-TERMINATING, KNITTED, METALIZED YARN EMI/RFI SHIELDING GASKET

[75] Inventor: Anthony Michael Sosnowski, Stroudsburg, Pa.

[73] Assignee: Instrument Specialties Co., Inc., Delaware Water Gap, Pa.

[21] Appl. No.: 819,983

[22] Filed: Mar. 18, 1997

[51] Int. Cl.⁶ ..................................................... H05K 9/00
[52] U.S. Cl. ................... 174/35 GC; 277/653; 277/920
[58] Field of Search ........... 174/35 GC, 35 MS, 174/35 R; 361/816, 818; 277/650, 652, 653, 920

[56] References Cited

U.S. PATENT DOCUMENTS

| | | | |
|---|---|---|---|
| 5,045,635 | 9/1991 | Kaplo et al. ........................ | 174/35 GC |
| 5,142,101 | 8/1992 | Matsuzaki et al. ................. | 174/35 GC |
| 5,294,270 | 3/1994 | Fenical ............................... | 148/576 |
| 5,386,345 | 1/1995 | Matsuzaki et al. ................. | 361/816 |
| 5,603,514 | 2/1997 | Jencks et al. ...................... | 277/230 |
| 5,804,762 | 9/1998 | Jones et al. ........................ | 174/35 GC |

*Primary Examiner*—Kristine Kincaid
*Assistant Examiner*—Hung V Ngo
*Attorney, Agent, or Firm*—Burns Doane Swecker & Mathis, L.L.P.

[57] ABSTRACT

A knitted metalized yarn gasket fashioned from a core, a first tubular layer formed from a hot melt yarn around the core, and a second tubular structure knitted from a conductive yarn and disposed over at least a portion of the first tubular layer and core assembly. The hot melt yarn forming the first tubular layer adheres the second tubular structure to the core such that fraying of the knit gasket is substantially prevented.

13 Claims, 3 Drawing Sheets

5,889,229

SELF-TERMINATING, KNITTED, METALIZED YARN EMI/RFI SHIELDING GASKET

BACKGROUND OF THE INVENTION

The present invention relates generally to EMI/RFI shielding devices, and more specifically, to a self-terminating EMI/RFI shielding gasket and a method of making the same.

Various types of EMI/RFI gaskets are known for reducing the transmission of electromagnetic interference (EMI) and radio frequency interference (RFI). Among the known devices are gaskets having a resilient core surrounded by a deformable wire-mesh gasket material. Suitable known wire-mesh materials are tin-plated phosphor bronze, tin-coated copper-clad steel, silver-plated brass, monel, beryllium copper and aluminum. Different core cross sections and materials are used depending upon the particular application. Wire-mesh gaskets are generally used to shield conventional computer or other electronic equipment by compressing the gasket around an openable access panel, door, or the like.

Known wire-mesh gaskets are manufactured in various lengths and then cut to size for particular installations. In so doing, however, the wire-mesh tends to fray at the terminal ends of the gasket and thus produces an unacceptable appearance. A secondary treatment such as the in situ application of an adhesive has previously been utilized to overcome the poor appearance of the fraying ends. That treatment is a labor intensive process, however, and is not well suited for quick and cost-productive installations.

Other prior art gaskets have attempted to overcome this problem by knitting a conductive layer over a foam core before the foam has completely cured. In such cases, the uncured foam adheres to the knitted layer to prevent the terminal ends from fraying; however, utilizing an uncured core presents problems of dimensional stability and thus limits the shapes and sizes that can be successfully manufactured. U.S. Pat. No. 5,045,635, assigned to Schlegel Corporation, for example, describes a process whereby a urethane foam core expands and cures in a traveling mold that is surrounded by a sheath with a conductive surface having embedded metal fibers or the like.

In addition to aesthetic considerations, EMI/RFI leakage may also occur due to the reduced shielding coverage that occurs as a result of the fraying terminal ends of the gaskets. Further, cutting the wire-mesh gasket during installation may produce particles of metallic debris within the shielded housing.

A further design consideration for EMI/RFI gaskets is galvanic compatibility in the ultimate application. More particularly, when a conductive gasket for excluding electromagnetic interference is placed between two metal flange plates or metalized plastic components, dissimilar metals having dissimilar electrochemical potentials are quite likely to be placed in contact with one another. The use of dissimilar metals or metal coating/plating in metalized plastics is expected because desirable attributes in flange plates, such as strength and rigidity, are not the same as those for gaskets, such as flexibility and maximum electrical conductivity. The difference in the electrochemical potential of the two dissimilar metals is the force that drives the movement of ions therebetween and thus causes galvanic corrosion. Heretofore, knitted gaskets have conventionally used silver plating as the conductive metal therein. While these gaskets function adequately in shielding against electromagnetic and radio frequency interference, the range of materials on which they can be utilized is limited due to the limited galvanic compatibility of the silver plating.

SUMMARY OF THE INVENTION

The present invention is directed to a gasket structure for shielding against electromagnetic and radio frequency interference and which overcomes the prior art problems associated with terminal end fraying without sacrificing dimensional stability of a core.

The gasket structure includes a first tubular layer formed from a hot melt yarn, a second tubular structure formed from a conductive yarn and disposed over at least a portion of the first tubular layer, and a core disposed within the first tubular layer. The hot melt yarn forming the first tubular layer adheres the second tubular structure to the core such that fraying of the gasket structure is substantially prevented. The first tubular layer is preferably knit around the core and the second tubular structure is then knit therearound. A preferred core material is a neoprene sponge and a preferred conductive yarn is a nylon yarn plated with silver, although tin, aluminum and nickel plating is also possible.

A further aspect of the present invention is directed to a method of forming a knitted metalized yarn gasket. The method includes selecting a core, selecting an adhesive yarn, selecting a conductive yarn, forming the adhesive yarn into a tubular layer around the selected core, constructing a composite tubular structure by forming the conductive yarn into a tubular structure surrounding at least a portion of the adhesive yarn tubular layer, and heating the composite tubular structure to melt the adhesive yarn such that the conductive yarn will adhere to the core. The method further includes, after the heating step, shaping the composite tubular structure by drawing it through a die. Finally, after the shaping step, the composite tubular structure is cooled and then cut to the desired length.

BRIEF DESCRIPTION OF THE DRAWINGS

Many objects and advantages of the present invention will be apparent to those skilled in the art when this specification is read in conjunction with the drawings wherein like reference numerals have been applied to like elements and wherein.

DETAILED DESCRIPTION OF THE PREFERRED EMBODIMENTS

Figure 1:
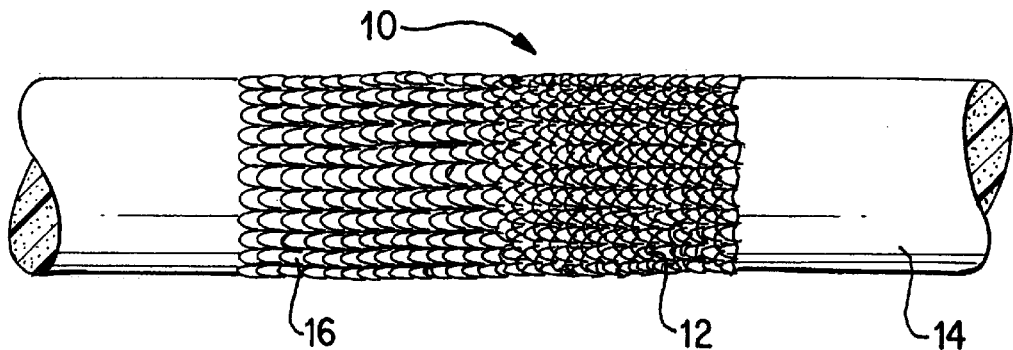
FIG. 1 is an elevational view of a knitted metalized yarn gasket according to the present invention, prior to heating and shaping.
Figure 2:
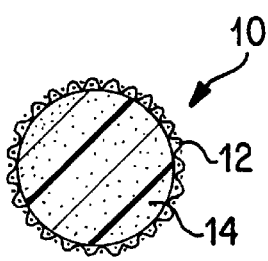
FIG. 2 is a cross-sectional view of a knitted metalized yarn gasket having a circular configuration according to the present invention.

Referring to FIG. 1, a knitted metalized yarn gasket in accordance with the present invention is shown generally by reference numeral 10. The gasket 10 includes a core 14, a first elongated tubular member or layer 16 formed from an adhesive yarn that circumferentially and longitudinally envelops the core 14, and a second elongated tubular member 12 formed from a conductive yarn that is disposed thereover. As shown in FIG. 2, the gasket 10 is illustrated as being circularly cylindrical in cross section; however, oval, elliptical, and polygonal cross-sectional shapes including square, rectangular, hexagonal and the like are also contemplated as being within the scope of the present invention.

The core 14 can be selected from any one of a variety of materials. A solid core is preferred for the present invention. The core 14 may be a circularly cylindrical element preferably fashioned of an elastomeric material, such as neoprene sponge. Neoprene sponge has a melt temperature of approximately 200° F. and will not be adversely affected by heat used to melt the adhesive yarn, as discussed below. Although neoprene has a slightly higher compression force than usually preferred for a gasket structure of this type, the neoprene sponge core demonstrates excellent dimensional stability during manufacture of the core. Other materials, such as urethane foam and polyurethane foam having lower compression forces, are also suitable for forming a gasket structure; however, obtaining dimensional stability with such materials is more difficult. As used herein, "solid" core material includes elastomers, foamed elastomers, composite materials, dual durometer composite materials, conductive polymers, polymers containing conductive inclusions, other resilient non-elastomeric materials and the like.

Figure 3:
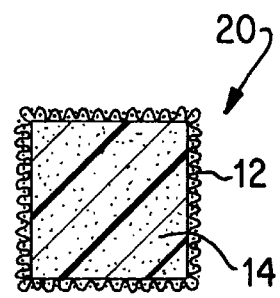
FIG. 3 is cross-sectional view of a knitted metalized yarn gasket having a square configuration according to the present invention.
Figure 4:
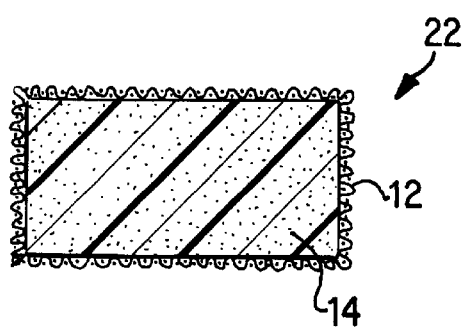
FIG. 4 is a cross-sectional view of a knitted metalized yarn gasket having a quadrilateral configuration according to the present invention.
Figure 5:
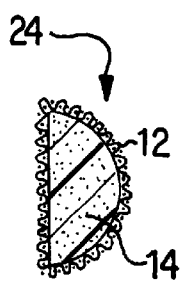
FIG. 5 is a cross-sectional view of a knitted metalized yarn gasket having an D-shaped configuration according to the present invention.
Figure 6:
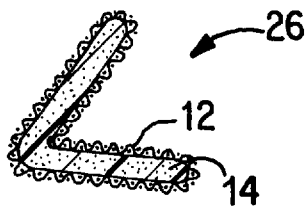
FIG. 6 is a cross-sectional view of a knitted metalized yarn gasket having a L-shaped configuration according to the present invention.
Figure 7:
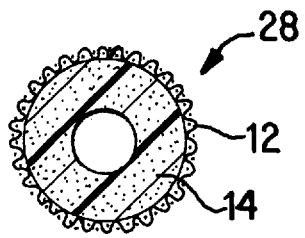
FIG. 7 is a cross-sectional view of a knitted metalized yarn gasket having a hollow circular configuration according to the present invention.

The core 14 is chosen to have a cross-sectional configuration identical to that desired for the final gasket 10. A gasket 20 having a square cross section as shown in FIG. 3, a gasket 22 having a quadrilateral or rectangular cross section as shown in FIG. 4, a gasket 24 having a D-shaped cross section as shown in FIG. 5 and a gasket 26 having a L-shaped cross section as shown in FIG. 6 must also have similarly shaped cores 14. In appropriate applications, the core 14 could possibly be hollow, as shown for gasket 28 in FIG. 7. Depending upon the application, the core could have one or more longitudinal holes running through it. Moreover, the core could be annular. Although gasket 10 is discussed in detail herein, it should be recognized by one skilled in the art that gaskets 20, 22, 24, 26, and 28 are similarly formed and that like reference numerals are being utilized to denote similar elements in each embodiment.

The first tubular member or layer 16 is preferably formed from a hot melt or adhesive yarn by a suitable knitting process, such as circularly knitting the hot melt yarn around the core 14. A preferred hot melt yarn is a nylon yarn coated with a polyamide adhesive, having a nylon core of 70 denier, a softening temperature of approximately 143° F., and a melt temperature of 300° F. This adhesive has a viscosity of 3,480 cps at 200° C., 1,610 cps at 225° C. and 780 cps at 250° C. The polyamide adhesive used therein has a quick set time, minimum of approximately 3 seconds, and excellent resistance to abrasion, washing, and dry cleaning solvents. Other hot melt yarns and other adhesive products could also be used so long as the melt temperature of the adhesive and the heating time necessary to achieve the melting thereof will not detrimentally affect the core 14 or the second tubular member 12. For instance, it is within the scope of this invention to utilize a tape or other type of adhesive medium that is spirally wound or otherwise disposed about the core. The adhesive must also be compatible with and capable of adhering to both the selected core material and the selected material of second tubular member 12, whether it be silver-plated nylon, tin-plated nylon or another conductive yarn.

The second tubular member 12 is preferably knit from a material having high electrical conductivity. High electrical conductivity is particularly desirable in EMI/RFI gaskets. A preferred material for the tubular member 12 is a metalized yarn such as a nylon yarn plated with silver. Yarn as used herein may also include nonmetallic filaments, metal coated polymeric filaments, and natural fibers. Other possible materials include aluminum-, tin- or nickel-plated nylon yarn or any other conductive yarn conventionally used in the production of gaskets. A tin-plated yarn is especially preferred due to the increased galvanic compatibility that is obtained, as discussed in greater detail below. Generally speaking, metalized yarn with a denier in the range of 70–300 is suitable, while a denier of about 200 is preferred.

In order to provide the knitted metalized yarn gasket 10 with both longitudinal and transverse compliance, the tubular member 12 may be formed by a suitable knitting process, such as a circular knitting. In such a knitted process, as shown in U.S. Pat. No. 5,294,270 to the present assignee, the entire contents of which are hereby incorporated by reference, a yarn is sinuously or serpentinely looped or bent into a band that is helically formed so that adjacent portions of the band overlap one another. In that overlapping area, yarn loops of one section of the band interengage yarn loops of the adjacent longitudinally displaced section of the band. This process results in a structure that has a substantial length in comparison to its transverse characteristic dimension, the diameter. With that helically knitted arrangement, longitudinal compliance is provided for the tubular member 12 since interengaged loops of the yarn are substantially free to slide longitudinally with respect to one another and with respect to loops of adjacent portions. Furthermore, lateral or radial compliance is also provided since the serpentine loops have little torsional resistance and are only constrained at the four spaced points where adjacent loops are engaged. As a result, when subjected to transverse force loads, the tubular member 12 readily undergoes deflection.

Although tubular member 12 is preferably knit around core 14 after adhesive tubular member 16 is knitted thereon, it is within the scope of the present invention that knitted tubular member 12 could be preformed from a conductive yarn and then disposed over or otherwise fastened about the adhesive covered core 14 due to the longitudinal compliance obtained by the knitting process. After melting of the adhesive yarn, however, one skilled in the art should recognize that the tubular member 12 is then adhered to the core 14 and further longitudinal movement will be prohibited.

While precise dimensions of the knitted metalized yarn gasket can be varied, generally speaking the gasket has a substantial length in relation to its transverse dimension or diameter. It has been found that a diameter of about 0.25 inch is suitable for many applications, although any diameter could of course be manufactured. The particular size of knitting loops is chosen such that the metalized yarn is knit around the core to obtain approximately 95% coverage over the core. For larger diameter gaskets, the size and length of the loops remain approximately the same, but the number of loops in each circumferential ring increases. Conversely, for smaller diameter gaskets, the number of loops in each circumferential ring decreases.

For applications where a higher density of conductors is desired, additional concentric knitted metalized yarn layers may be used, if a corresponding adjustment in the hot melt layer is made as well. In most applications, the various layers will be made from the same conductive yarn, silver plated nylon in this instance. It is, however, within the purview of this invention to make each of the layers from a different yarn or a different construction method.

Another alternative contemplated here is the use of multiple conductive yarns during a braiding process. For example, a plurality of yarns could be simultaneously braided to form tubular member 12. The presence of multiple yarns would increase both the number of conductors and the size of the contact area. However, the use of multiple conductive yarns in a braiding process would increase the material requirements of the tubular member by approximately twenty fold; thus, also significantly increasing the cost of production. The hot melt yarn could also possibly be braided around the core, but again, this would significantly increase the material requirements and the cost of production. On the other hand, a multi-strand knitted layer may be formed from one or both of the hot melt yarn and the metalized yarn in order to increase density without substantially increasing the cost of production.

Theoretically speaking, an EMI/RFI gasket with the very best performance would be a continuous conductor having perfect contact with both opposing surfaces that are being sealed. In the real world, however, contact with opposing surfaces is not perfect. In addition, substantial bending stresses in the gasket materials can lead to cracks and other mechanical failures. Thus, the knitted metalized yarn gasket is a compromise. The knitting of the metalized yarn gaskets creates certain openings therethrough. Where a shielding device has openings, the EMI/RFI shielding effectiveness is frequency dependent. At high frequencies, those openings can, themselves, become leakage points for electromagnetic radiation. Additionally at high frequencies, self-inductance of the knitted metalized yarn structure increases the impedance across the gasketed joint. The result is a mismatch in electrical potential between the two enclosure surfaces which produces a radiated field. Accordingly, knitted metalized yarn gaskets of the type described in this specification are suitable for use where the electromagnetic frequency being shielded lies in the range between 500 Mhz and 10 Ghz.

The circular knitting process of the present invention also allows a conductive metal yarn to be plated as appropriate to assure galvanic compatibility with a wide range of materials, thereby increasing the usage applications of the present invention. In particular, a tin-plated nylon yarn can be knitted to form the tubular structure 12 in accordance with the present invention. An aluminum- or nickel-plated nylon yarn is also contemplated as being within the scope of the present invention. Nickel, tin and aluminum have electrochemical potentials closer to those of the materials from which flanges are likely to be manufactured; and thus have a greater galvanic compatibility than silver. Therefore, since the difference in the electrochemical potentials between dissimilar metals can be reduced, galvanic corrosion can be reduced as well.

Figure 8:
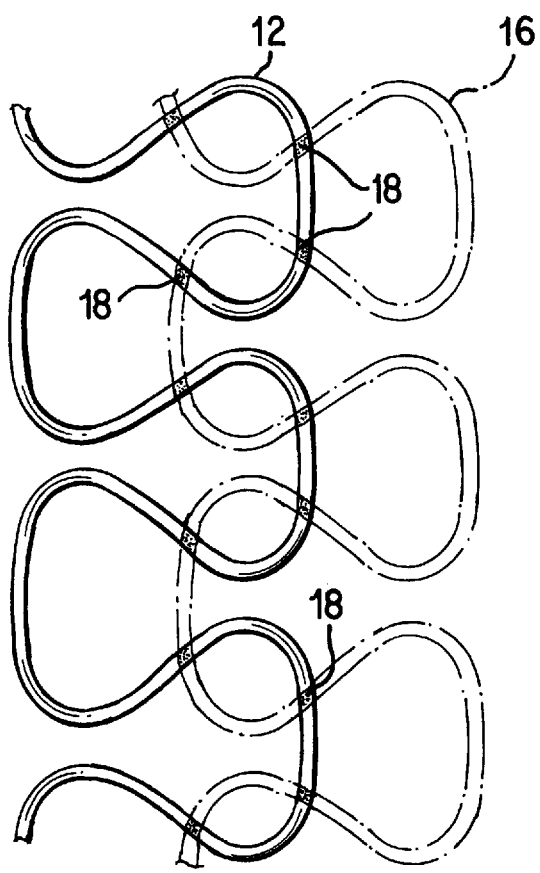
FIG. 8 is an enlarged schematic illustration of the overlapping knits of a knitted metalized yarn gasket according to the present invention.
Figure 9:
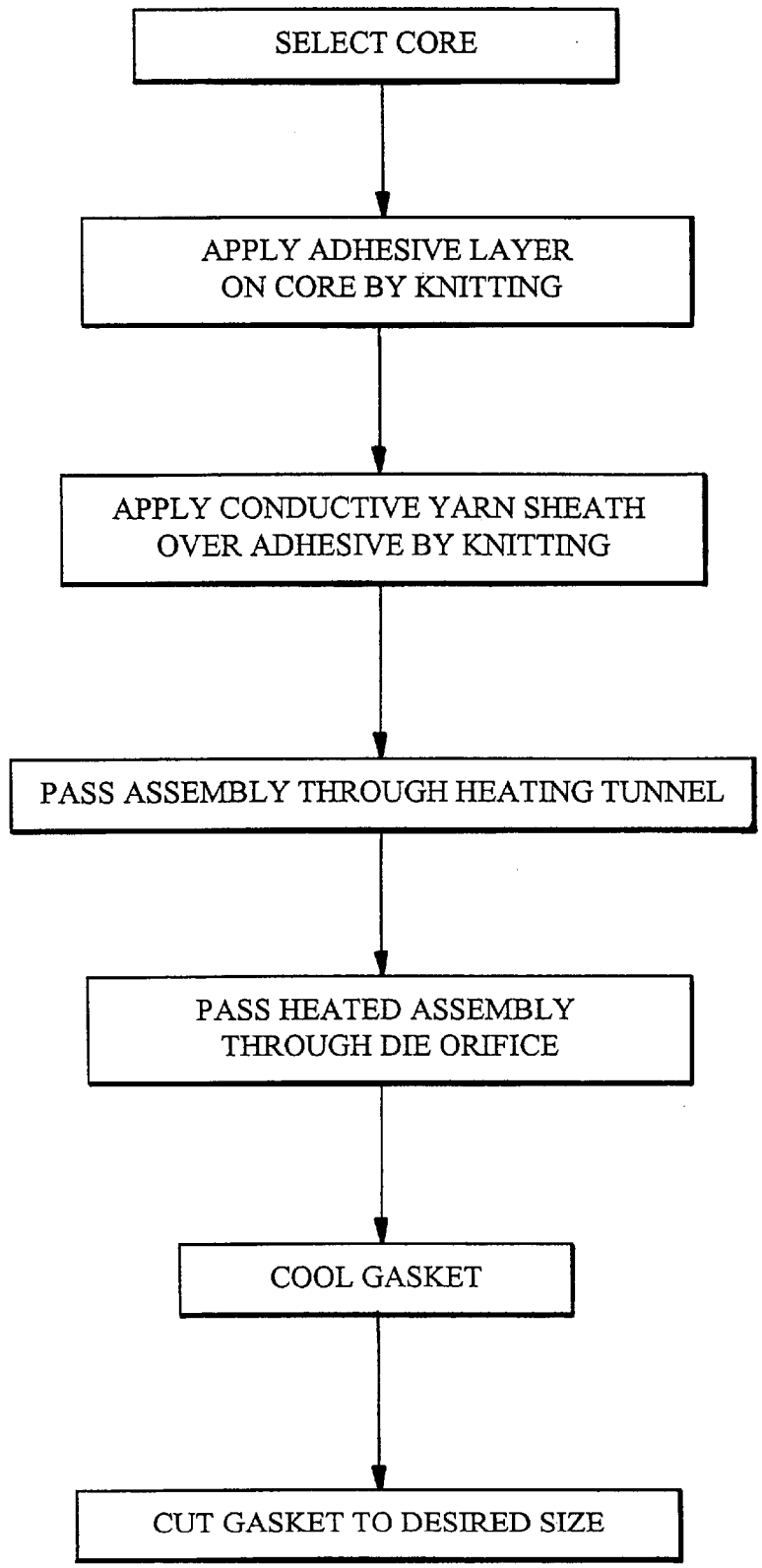
FIG. 9 is a flow chart diagram illustrating the process of making a knitted metalized yarn gasket in accordance with the present invention.

Turning now to the method of making a knitted metalized yarn gasket according to the present invention, as shown in the diagram of FIG. 8, a suitable elastomeric core is selected. The core may be selected from any elastomer that is stable and capable of withstanding the melt temperature of the selected hot melt yarn without significant degradation. As discussed above, neoprene sponge provides the required dimensional stability and demonstrates suitable compression characteristics when subjected to the heating parameters necessary for melting the selected hot melt yarn of the present invention. Other elastomers and elastomer sponges could of course also be used with this invention.

Referring to the second step in the FIG. 8 diagram, an adhesive is chosen and disposed over the core. Preferably, the adhesive is a hot melt yarn that is machine knitted into a tubular member or layer 16 over the core 14. The hot melt yarn forms a very pliant, non-self-supporting tubular layer around the core, and thus relies upon the core for support. The hot melt yarn is also very temperature sensitive. The preferred hot melt yarn having a weight of 70 denier provides sufficient adhesion for the present invention. Other adhesives could of course also be used. The adhesive must be selected, however, such that the temperature and time of exposure required to melt the adhesive will not adversely affect either the selected core 14 or the tubular member 12 formed from the selected conductive yarn. If a heavier adhesive is used, the melt time may need to be increased in order to achieve a thorough melting of the adhesive; in addition, a heavier adhesive may tend to bleed through the knitted metalized yarn tubular member. On the other hand, if a lighter adhesive is used, there may not be enough adhesive to securely adhere the knitted metalized yarn tubular member to the core. Thus, a hot melt yarn having a weight between 70 denier and 300 denier is best suited for the present invention.

A conductive material is then chosen, such as the preferred silver-plated nylon yarn. The selected conductive yarn is formed into a tubular shape. That tubular shape is also accomplished by machine knitting, or more preferably, by circularly knitting the conductive yarn around the assembly of the core and hot melt yarn tubular member. The diameter of the knitted tubular member 14 should be the minimum that is needed for the tubular member 14 to be closely disposed over the assembly of the core and hot melt yarn tubular layer. For a rectangular or D-shaped core member, for instance, the diameter of the tubular member 12 is chosen such that the longitudinal compliance and radial compliance of the knitting allows the circular-shaped tubular member 12 to loosely stretch around the dissimilar-shaped core 14. A composite tubular structure is thus formed including core 14, hot melt yarn tubular member 16, and conductive yarn tubular member 12.

The composite tubular structure is then passed through a heating tunnel in order to melt the adhesive on the hot melt yarn. Using the preferred hot melt yarn, core material and conductive yarn as described herein, the composite tubular structure is heated to approximately 250°–300° F. for 3–5 seconds such that the adhesive is sufficiently melted to adhere the conductive yarn tubular member to the core. It will be apparent to one skilled in the art that adjustments to the time of exposure and the temperature will need to be made based upon the particular hot melt yarn or other type of adhesive that is used, as well as the type of conductive yarn used to form tubular member 12 and the number of knitted layers therein.

After heating, the still warm composite tubular structure is drawn through a TEFLON® (polytetrafluroethylene) die shaped to the desired final configuration of the gasket. That is, if the final gasket will have a circular cross section as shown in FIG. 2, then the die must also have a circular cross section, respectively. Similarly, if the final gasket has a D-shaped cross section, as shown in FIG. 5, then the die must also have a D-shaped cross section, respectively. As the assembled core, heated adhesive, and outer conductive tubular member move through the die, the die presses or irons the conductive tubular member onto the core such that it adheres to the core and conforms to the shape of the core. The longitudinal and radial compliance of the knitted tubular member 12, which allows the minimum diameter to be selected for the tubular member, also allows the die to adjust the final size and shape of the outer layer to conform closely to the size and shape of the core. The die is either TEFLON® coated or solid TEFLON® in order to prevent the still warm gasket from adhering thereto; however, it will be apparent to one skilled in the art that other types of anti-adhesion coatings and/or materials could be used as well.

After being shaped in the die, the gasket is allowed to air cool either at room temperature or with forced air such as a fan or the like. Finally, the finished gasket 10 may cut to the desired length, further treated with a pressure sensitive adhesive tape for use in the ultimate installation, packaged for shipping, or further fabricated for a particular installation.

While the shaping step is described above in connection with several particular cross sections, it is within the scope of the invention to shape the gasket to any desired cross section or angle. Likewise, it is within the scope of the invention to shape the gasket to any curved shape that may be desired.

One skilled in the art will recognize that a certain heating requirement or heat flux (J/s) is necessary in order to heat the composite tubular structure in the heating tunnel and thereby melt the selected hot melt yarn. The temperature in the heat tunnel to which the composite tubular structure is heated and the duration of time for which the structure is exposed to this temperature must be chosen based upon at least the two parameters. First, the tunnel temperature and time of duration must be great enough to cause the selected hot melt yarn or other adhesive to fully melt. Second, however, the temperature and time must be less than that required to melt or otherwise adversely affect either the core or the knitted conductive yarn. Thus, the linear speed at which the present invention can be produced is that speed at which the length of time in the heating tunnel produces the required heat flux subject to the above two parameters.

Referring to FIG. 8, the tubular layer 16 formed from the knitted hot melt yarn or other adhesive (shown in broken lines for clarity) adheres the knitted metalized yarn tubular member 12 (shown in solid lines for clarity) to core 14 at a plurality of overlapping contact points 18. In so doing, the present invention substantially prevents fraying of the terminal ends of gasket 10 when it is cut or otherwise sized for a particular installation; thus, gasket 10 is "self-terminating". More particularly, each knitted loop of the conductive yarn tubular member 12 is adhered to the core 14 at a plurality of points 18 where the tubular member 12 overlaps adhesive tubular member 16. The terminal ends of knitted gasket 10 are thus prevented from unravelling when cut, there is no debris that occurs within the shielded structure, and no secondary treatments are required to obtain an aesthetically pleasing surface when the gasket is installed on enclosure frames. In addition, the smooth, soft surface obtained from a knitted metalized yarn insures against the scratching of metalized coatings on plastic interfaces.

It should now be apparent that a new useful and unobvious knitted metalized yarn EMI/RFI shielding gasket has been described which overcomes problems of the type noted in connection with the prior art. It will also be apparent to those skilled in the art that numerous modifications, variations, substitutions, and equivalents exist for elements of the knitted metalized yarn EMI/RFI shielding gasket described above. Accordingly, it is expressly intended that all such modifications, variations, substitutions, and equivalents for features of the invention as defined in the appended claims be embraced thereby.

What is claimed is:

1. A gasket structure for shielding against electromagnetic and radio frequency interference, said gasket structure comprising:

a core;

a first tubular layer formed from a hot melt yarn and having a length and a transverse dimension, said first tubular layer circumferentially and longitudinally enveloping said core; and a second tubular structure formed from a conductive yarn and having a length and a transverse dimension, said second tubular structure being disposed over at least a portion of said first tubular layer;

wherein said hot melt yarn forming said first tubular layer adheres said second tubular structure to said core at a plurality of contact points such that fraying of said gasket structure is substantially prevented.

2. The gasket structure according to claim 1 wherein said core includes a neoprene sponge.

3. The gasket structure according to claim 1 wherein said conductive yarn includes a nylon yarn plated with silver.

4. The gasket structure according to claim 1 wherein said first tubular layer is knitted from said hot melt yarn.

5. The gasket structure according to claim 4 wherein said knitted first tubular layer is formed by circular knitting.

6. The gasket structure according to claim 1 wherein said second tubular structure is knitted from said conductive yarn.

7. The gasket structure according to claim 6 wherein said knitted second tubular structure is formed by circular knitting.

8. The gasket structure according to claim 7 wherein said conductive yarn includes a nylon yarn plated with tin.

9. The gasket structure according to claim 7 wherein said conductive yarn includes a nylon yarn plated with aluminum.

10. The gasket structure according to claim 1 wherein said core includes an elastomer foam.

11. The gasket structure according to claim 1 wherein said core has a L-shaped cross-sectional configuration.

12. The gasket structure according to claim 1 wherein said core has a D-shaped cross-sectional configuration.

13. The gasket structure according to claim 1 wherein said core has a quadrilateral cross-sectional configuration.

* * * * *